(12) United States Patent
Asbury et al.

(10) Patent No.: US 9,299,415 B1
(45) Date of Patent: Mar. 29, 2016

(54) METHOD AND APPARATUS FOR AUTOMATIC TRANSITION OF A VOLATILE MEMORY BETWEEN LOW POWER STATES

(71) Applicant: Marvell International Ltd., Hamilton (BM)

(72) Inventors: Raymond C. Asbury, Eagle, ID (US); Tony R. Uranga, Wilder, ID (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/178,145

(22) Filed: Feb. 11, 2014

Related U.S. Application Data

(60) Provisional application No. 61/763,184, filed on Feb. 11, 2013.

(51) Int. Cl.
*G11C 11/4063* (2006.01)
*G11C 11/24* (2006.01)

(52) U.S. Cl.
CPC ............ *G11C 11/4063* (2013.01); *G11C 11/24* (2013.01)

(58) Field of Classification Search
USPC .......................................................... 365/149
See application file for complete search history.

(56) References Cited

U.S. PATENT DOCUMENTS

| 7,187,220 | B1 * | 3/2007 | Alben | ........................ | H03L 7/06 327/156 |
| 7,657,775 | B1 * | 2/2010 | Wagner | ..................... | G06F 1/06 327/144 |
| 8,661,284 | B2 * | 2/2014 | Alexander | ............... | G11C 7/22 365/227 |

\* cited by examiner

*Primary Examiner* — Anthan Tran
*Assistant Examiner* — Mushfique Siddique

(57) ABSTRACT

Some of the embodiments of the present disclosure provide a system comprising a memory configured to operate in one of a plurality of states; a phase locked loop (PLL) configured to (i) receive a first clock signal, and (ii) based on the first clock signal and a state at which the memory operates, selectively generate a second clock signal; and a clock selection module configured to, based on the state at which the memory operates, selectively provide one of (i) the first clock signal and (ii) the second clock signal to the memory.

16 Claims, 3 Drawing Sheets

METHOD AND APPARATUS FOR AUTOMATIC TRANSITION OF A VOLATILE MEMORY BETWEEN LOW POWER STATES

CROSS REFERENCE TO RELATED APPLICATIONS

The present disclosure claims priority to U.S. Provisional Patent Application No. 61/763,184, filed on Feb. 11, 2013, which is incorporated herein by reference.

TECHNICAL FIELD

Embodiments of the present disclosure relate to volatile memories, and more particularly, to transition of a volatile memory between low power states.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

A dynamic memory, e.g., a dynamic random-access memory (DRAM), needs to be always powered in order to maintain data in the memory. A DRAM usually consumes significant amount of power. When the DRAM is to be accessed, the DRAM has to operate at a minimum operating frequency, which may require that an entire memory access system operates at the minimum operating frequency. When no access is made to the DRAM, the DRAM can operate in a self-refresh mode and at a low frequency (e.g., lower than the minimum operating frequency); however, the DRAM cannot be accessed while operating at the self-refresh mode.

SUMMARY

In various embodiments, the present disclosure provides a system comprising a memory configured to operate in one of a plurality of states; a phase locked loop (PLL) configured to (i) receive a first clock signal, and (ii) based on the first clock signal and a state at which the memory operates, selectively generate a second clock signal; and a clock selection module configured to, based on the state at which the memory operates, selectively provide one of (i) the first clock signal and (ii) the second clock signal to the memory.

In various embodiments, the present disclosure also provides a method comprising operating a memory in one of a plurality of states; receiving, by a phase locked loop (PLL), a first clock signal; based on (i) the first clock signal and (ii) a state at which the memory operates, selectively generating, by the PLL, a second clock signal; and based on the state at which the memory operates, selectively providing one of (i) the first clock signal and (ii) the second clock signal to the memory.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

Figure 1:
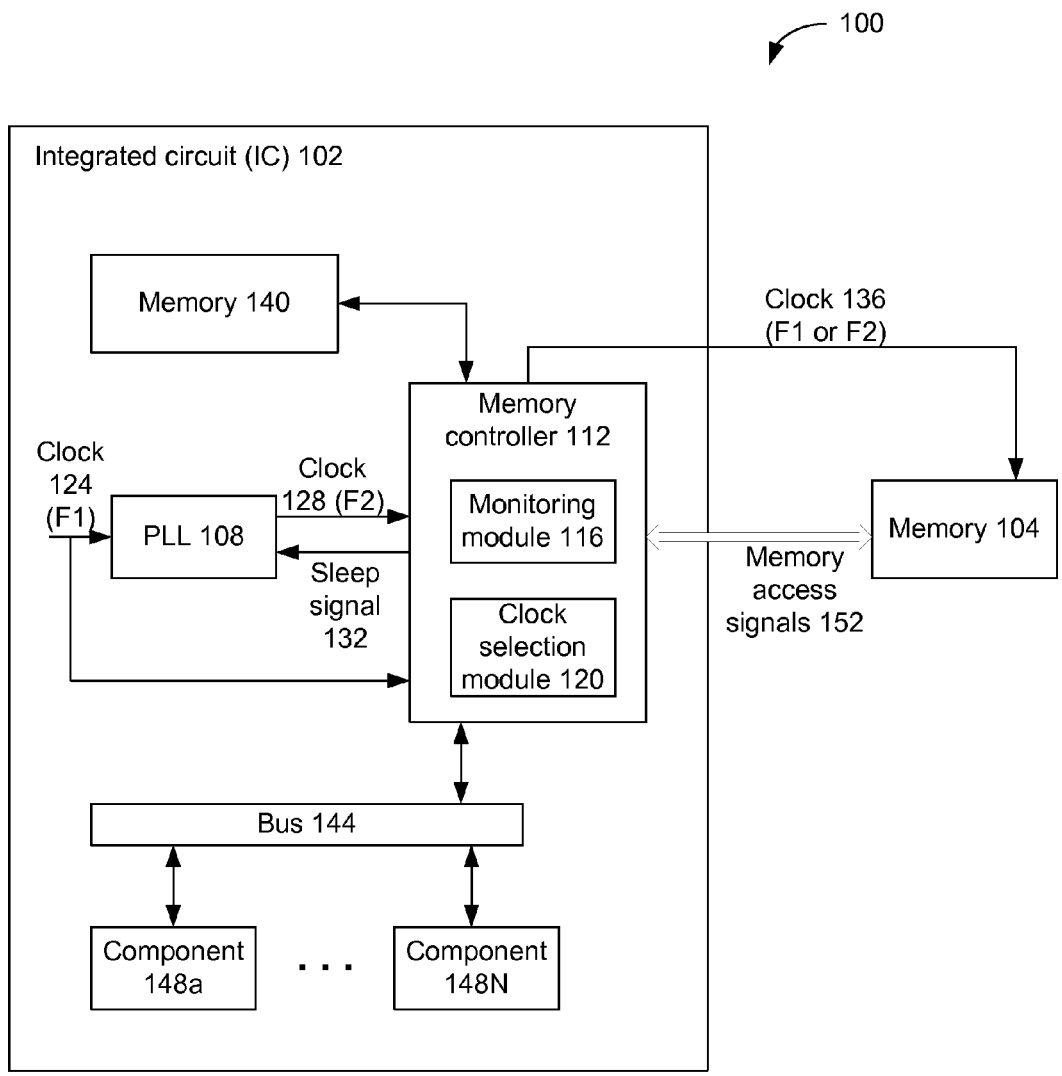
FIG. 1 schematically illustrates a system for accessing a memory and enabling the memory to selectively transition between various low frequency states.

FIG. 1 schematically illustrates a system 100 for accessing a memory 104 and enabling the memory 104 to selectively transition between various low frequency states. The system 100 comprises an integrated circuit (IC) 102, and a memory 104 that is external to the IC 102 (although, in another embodiment, the memory 104 may be included in the IC 102). In an embodiment, the memory 104 is a volatile memory (e.g., requires power to maintain data stored in the memory 104), e.g., a dynamic random-access memory (DRAM). In an embodiment, the system 104 is included in a printing device (e.g., a printer), although the system 100 can be included in any other appropriate type of devices.

The IC 104 comprises a phase-locked loop (PLL) configured to receive a clock signal 124 (henceforth referred to herein as "clock 124"), and to generate a clock signal 128 (henceforth referred to herein as "clock 128") based on the clock signal 124. The clock 124 has a frequency of F1 and the clock 128 has a frequency of F2. In an embodiment, the clock 128 is faster (e.g., having a higher frequency) than the clock 124 (i.e., the frequency F2 is higher than the frequency F1).

In an embodiment, the frequency F2 is a minimum frequency at which the memory 104 needs to operate while being accessed (e.g., while data is written to, or read from the memory 104). In an embodiment, the frequency F1 is a minimum frequency at which the memory 104 needs to operate while the memory 104 can refresh data stored in the memory 104, cannot be accessed (e.g., data is not written to, or read from the memory 104). That is, while the memory 104 operates at frequency F1, the memory cannot be accessed, but the data stored in the memory 104 can be refreshed. In an example, frequency F1 is 25 Mega Hertz (MHz), i.e., the clock 124 has a frequency of 25 MHz; and frequency F2 is 200 MHz, i.e., clock 128 has a frequency of 200 MHz.

The IC 102 further comprises a memory controller 112. The memory controller 112 receives the clock 124 and the clock 128, and outputs a clock signal 136 (henceforth referred to herein as "clock 136") to the memory 104. The memory controller 112 comprises a monitoring module 116 and a clock selection module 120. In an embodiment, the monitoring module 116 monitors or keeps track of a state of operation of the memory module 104. Based on the state of the memory 104, the clock selection module 120 selects one of the clocks 124 and 128, and outputs the selected one of the clocks 124 and 128 as the clock 136 to the memory 104. Although FIG. 1 illustrates the monitoring module 116 and the clock selection module 120 being included in the memory controller 112, in another embodiment, one or both the monitoring module 116 and the clock selection module 120 may be external to the memory controller 112. In an embodiment, the memory controller also transmits a sleep signal to the PLL 108.

The memory controller 112 also comprises various other components (e.g., a direct memory access (DMA) module) that are used for accessing and/or controlling the memory 104, although these components are not illustrated in FIG. 1. The memory controller 112 also interacts with the memory 104 using one or more signals (labeled as memory access signals 152 in FIG. 1), e.g., to access the memory 104 (e.g., write to and/or read from the memory 104), to control the memory 104, and/or the like.

The IC 102 further comprises a bus 144 coupled to the memory controller 112. The bus 144 is also coupled to a plurality of components 148a, ..., 148N. One or more of the components 148a, ..., 148N access the memory 104 through the bus 144 and the memory controller 112. The components 148a, ..., 148N represent any appropriate components of the IC 102 that access the memory 104, e.g., one or more processing cores, firmware and software associated with the IC 102, an operating system associated with the IC 102, a driver circuit, an input/output port of the IC 102, a buffer, and/or the like. Although the components 148a, ..., 148N are illustrated to be included in the IC 102, in an embodiment, one or more of the components 148a, ..., 148N may be external to the IC 102.

In an embodiment, the IC 102 further comprises a memory 140. That is, the memory 140 is internal to the IC 102. The memory 140 communicates with the memory controller 112, e.g., to transmit and/or receive data with one or more of the components 148a, ..., 148N via the memory controller 112. In an embodiment, the memory 140 is any appropriate type of memory, e.g., a volatile memory (e.g., a DRAM), a read only memory (ROM), or the like.

Figure 2:
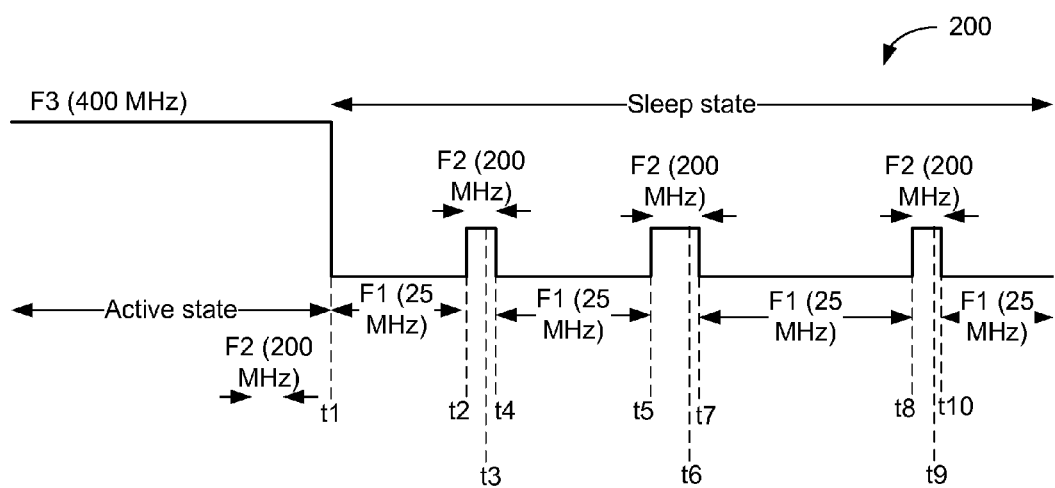
FIG. 2 is a timing diagram illustrating an operation of the system of FIG. 1.

FIG. 2 is a timing diagram illustrating an operation of the system 100 of FIG. 1. The memory 104 operates in an active state when, for example, data is actively (e.g., continuously) being written to and/or read from the memory 104. In an example, the system 104 is included in a printing device (e.g., a printer), and the memory 104 is in the active state when, for example, a page is being printed in the printing device (e.g., to print the page, data has to be continuously written to and/or read from the memory 104). While in an active state, the memory 104 operates at a frequency F3, which is substantially higher than the frequencies F1 and F2. As an example, frequency F3 is 400 MHz, while the frequencies F1 and F2 are 25 MHz and 200 MHz, respectively. For example, as illustrated in FIG. 2, prior to time t1, the memory 104 operates in the active state, i.e., at the frequency F3. Although the memory 104 can be accessed while the memory 104 operates both at the frequencies F2 and F3, a speed of accessing the memory at frequency F3 is substantially higher than a speed of accessing the memory at frequency F2.

Although not illustrated in FIG. 1, while the memory 104 operates in the active state, the memory 104 receives a clock signal with a frequency of F3 (e.g., from the PLL 108 via the memory controller 112, from another PLL not illustrated in FIG. 1, or from any other appropriate source). Operation of the memory 104 in the active state is outside the scope of this disclosure. Accordingly, a more detailed description of the operation of the memory 104 in the active state is not presented herein.

While data is not being actively written to and/or read from the memory 104, the memory 104 transitions from the active state to a non-active state, also referred to herein as a sleep state or a low-power state. In the example in which the system 100 is included in the printing device, the memory 104 is in the sleep state when, for example, no page is being printed in the printing device. Transition of the memory 104 between the active state and the sleep state is being controlled, for example, by an operating system associated with the system 100, firmware associated with the system 100, the memory controller 112, or the like. Transition of the memory 104 between the active state and the sleep state is outside the scope of this disclosure. Accordingly, a more detailed description of the transition of the memory 104 between the active state and the sleep state is not presented herein.

Referring to FIGS. 1 and 2, while in the sleep state, the memory 104 operates in one of the frequencies F1 and F2. While in the sleep state, minimal or no data is being written to and/or read from the memory 104. In an embodiment, the sleep state comprises a deep sleep state (also referred to as a self-refresh state). While no data is being written to or read from the memory 104, the memory 104 enters the deep sleep state, during which the memory 104 operates at the frequency F1. The deep sleep state is also referred to as the self-refresh state, as during this state, the memory 104 (which is a volatile memory) needs minimal power to periodically refreshes the data stored in the memory 104. As illustrated in FIG. 2, the memory 104 is in the self-refresh state between times t1 and t2, times t4 and t5, and times t7 and t8. During the self-refresh state, although the memory 104 periodically refreshes the data stored in the memory 104, data cannot be written to or read from the memory 104. That is, the memory 104 cannot be accessed while the memory 104 operates at the self-refresh state.

In an embodiment, while the memory 104 operates in the self-refresh state, the clock selection module 120 selects the clock 124, having frequency F1, and outputs the clock 124 as the clock 136 to the memory 104. That is, during the self-refresh state, the memory 104 receives the clock 136 having frequency F1, based on the clock selection module 120 selecting the clock 124. For example, as illustrated in FIG. 2, from time t1 to time t2, the clock 136 comprises the clock 124 having frequency F1. Furthermore, while the memory 104 operates in the self-refresh state, as the memory 104 receives the clock 124 (e.g., in the form of the clock 136), the output of the PLL 108 (i.e., the clock 128) has no use. Accordingly, while the memory 104 operates in the self-refresh state, the memory controller 112 transmits a sleep signal 132 to the PLL 108, instructing the PLL 108 to enter a low power or sleep mode.

In an embodiment, the sleep state of the memory 104 further comprises a partial sleep state. While operating in the self-refresh state, the memory 104 may partially wake up for a short period, e.g., to operate in a partial sleep state. For example, while the memory 104 is in the sleep state, the system 100 may need to read from and/or write to the memory 104 small amount of data (e.g., while the system 100 communicates with another device not illustrated in FIG. 1, while the system 100 discovers other devices that are to communicate with the system 100, while the system 100 receives a message from another device communicatively coupled to the system 100, and/or the like). During the partial sleep state, data stored in the memory 104 is refreshed, and also, the memory 104 can be accessed (i.e., data can be written to or read from the memory 104). In contrast, during the self-refresh state, the memory 104 only periodically refreshes the data stored in the memory 104, but the memory 104 cannot be accessed. In an embodiment, during the partial sleep state, the memory 104 operates at frequency F2. As illustrated in FIG. 2, the memory 104 is in the partial sleep state between times t2 and t4, times t5 and t7, and times t8 and t10. During the partial sleep state, a speed at which data is written to or read from the memory 104 is less than a speed at which data is written to or read from the memory 104 during the active state.

While the memory 104 operates in the self-refresh state, the monitoring module 116 monitors for any attempt made by one of the components 148a, ..., 148N, via the bus 144 and the memory controller 112, to access the memory 104 (e.g., to read from, or write to the memory 104). If the monitoring module 116 detects an attempt to access the memory 104, the monitoring module 116 facilitates the memory 104 to switch from the self-refresh state to the partial sleep state. For example, at time t2, the monitoring module 116 detects an attempt to access the memory 104, based on which the memory 104 enters the partial sleep state at time t2. From time t2, the memory controller 112 transmits, via the sleep signal 132, an instruction to the PLL 108, instructing the PLL 108 to wake up and start generating the clock 128. Also form time t2, the clock selection module 120 selects the clock 128, having frequency F2, and outputs the clock 128 as the clock 136 to the memory 104. That is, when the memory enters the partial sleep state at time t2, the memory 104 receives the clock 136 having frequency F2, based on the clock selection module 120 selecting the clock 128, as illustrated in FIG. 2.

When an attempt is made to access the memory 104 while the memory 104 operates in the self-refresh state, there may be a delay or latency involved in waking up the PLL 108, switching the clock signal that is transmitted to the memory 104 and/or transitioning the memory 104 from the self-refresh state to the partial sleep state. However, such a delay or latency is usually small, and lasts for only one or two memory access instructions (e.g., one or two memory read instructions and/or memory write instructions). Furthermore, for example, when an attempt is made to access the memory 104 using a memory write instruction while the memory 104 operates in the self-refresh state, the memory controller 112 can temporarily store the write data in the memory 140, while the memory 104 transitions from the self-refresh state to the partial sleep state. Once the memory 104 has transitioned from the self-refresh state to the partial sleep state, the write data temporarily stored in the memory 140 may then be transferred to the memory 140 (e.g., by the memory controller 112).

In an embodiment, the memory 140 stores data that may be required to be accessed (e.g., by one or more of the components 148a, ..., 148N) to operate the system 100, while the memory 104 is in the self-refresh state. Such storage of data by the memory 140 enables the memory 104 to be in the self-refresh state for a longer duration, and requires less frequent transition from the self-refresh state to the partial wake up state.

As previously discussed, in the partial sleep state, the memory 104 is being accessed only for a short period of time (e.g., for writing to or reading from the memory 104 only small amount of data). For example, accessing (i.e., writing to and/or reading from) the memory 104 is completed by time t3. After the last access is made to the memory 104 at time t3, the monitoring module 116 monitors access to the memory 104 for at least for a threshold period of time. If the monitoring module 116 fails to detect any attempt to access the memory 104 during the threshold period of time, at the end of the threshold period of time (e.g., at time t4) the memory 104 re-enters the self-refresh state. For example, the difference in times t3 and t4 of FIG. 2 (e.g., and also each of the difference in times t6 and t7, difference in times t9 and t10) represents the threshold period of time. Thus, at time t4, when the memory 104 re-enters the self-refresh state, the clock selection module 120 selects the clock 124, having frequency F1, and outputs the clock 124 as the clock 136 to the memory 104 (i.e., the memory 104 receives the clock 136 having frequency F1). Furthermore, at time t4, when the memory 104 re-enters the self-refresh state, the PLL 108 also enters the low power mode or the sleep mode (e.g., based on instructions received from the memory controller 112 via the sleep signal 132).

The memory 104 of FIG. 1 automatically transitions between various low frequency states. For example, as discussed, during times t1 and t2, times t4 and t5, and times t7 and t8, the memory 104 operates in the self-refresh state and at frequency F1; and during times t2 and t4, times t5 and t7, and times t8 and t10, the memory 104 operates in the partial sleep state and at frequency F2, where frequencies F1 and F2 are substantially lower than the frequency F3 at which the memory 104 operates while in the active state. Automatic transition between the various low frequency states (i.e., between the self-refresh state and the partial sleep state) enables the memory 104 to consume less power, without significantly sacrificing any performance of the memory 104. Furthermore, only a single PLL 108 is needed to enable the memory 108 to operate in the self-refresh state and the partial sleep state.

In an embodiment, the transition of the memory 104 between the self-refresh state and the partial sleep state is invisible or transparent to the components 148a, ..., 148N. For example, while the memory 104 is in the self-refresh state, the component 148a may attempt to access the memory 104, without knowing that the memory 104 is in the self-refresh state. Based on the component 148a attempting to access the memory 104 while the memory 104 is in the self refresh state, the memory controller 112 enables the memory 104 to transition to the partial sleep state and provide access of the memory 104 to the component 148a. Thus, the component 148a remains unaware of the memory 104 ever being in the self-refresh state. Similarly, the transitioning of the PLL between the wake up state and the sleep state is also invisible or transparent to the components 148a, ..., 148N.

Figure 3:
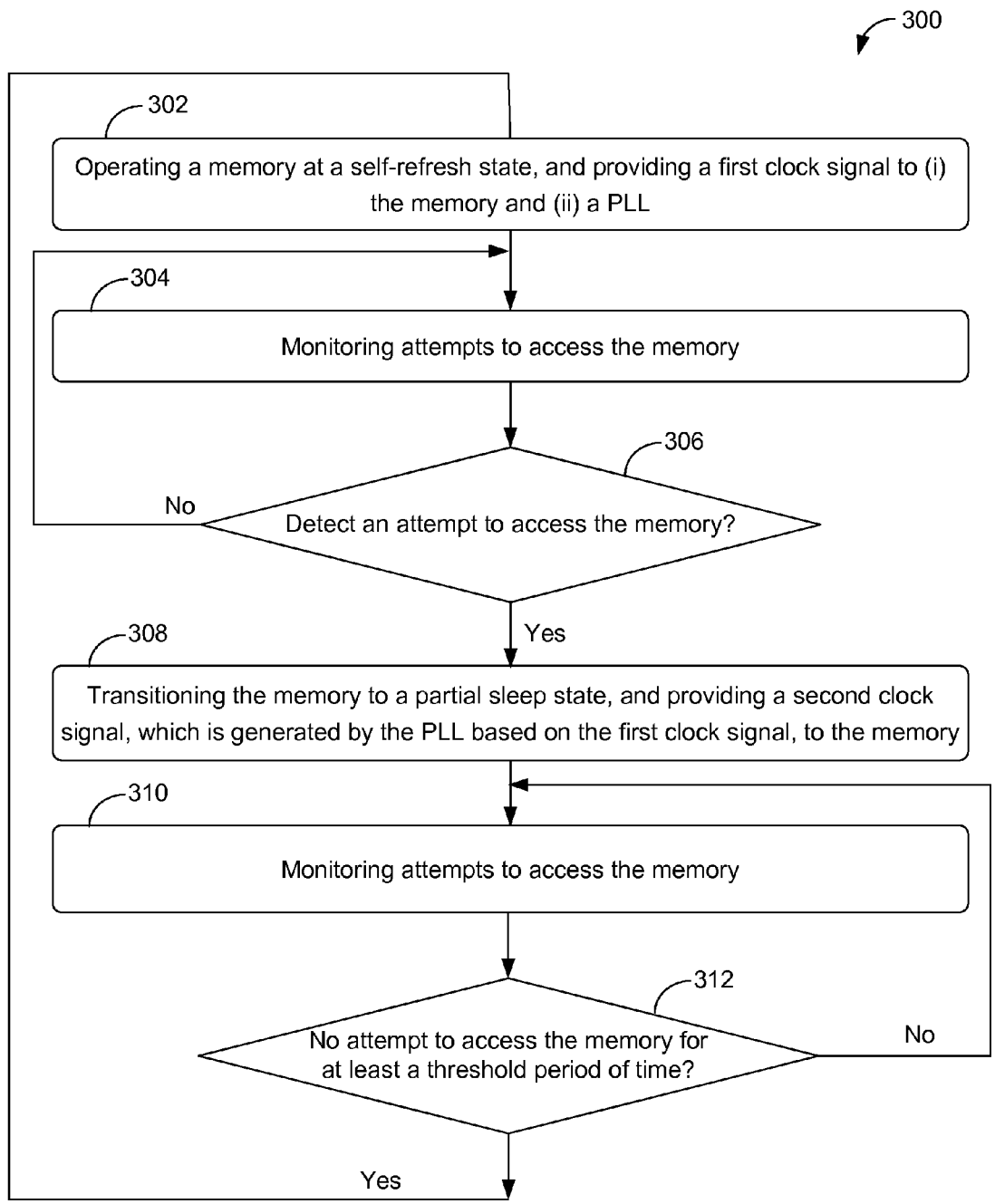
FIG. 3 illustrates an example method for operating the system of FIG. 1.

FIG. 3 illustrates an example method 300 for operating the system 100 of FIG. 1. At 302, a memory (e.g., the memory 104) operates in a self-refresh state, and a first clock signal (e.g., the clock 124 having frequency F1) is selected (e.g., by the clock selection module 120) and provided to (i) the memory and (ii) a PLL (e.g., the PLL 108). In an embodiment, while the memory operates in the self-refresh mode, the PLL does not generate any clock signal. At 304, attempts to access the memory is continually monitored (e.g., by the monitoring module 116). At 306, a determination is made as to whether an attempt is detected to access the memory. If no attempt is made, the method 300 loops back to 304, where attempts to access the memory is monitored.

If an attempt to access the memory is detected at 306, then at 308, the memory is transitioned to operate in a partial sleep state. Based on the first clock signal, the PLL starts generating a second clock signal (e.g., the clock 128 having frequency F2), and the memory is provided the second clock signal. At 310, attempts to access the memory is continually monitored (e.g., by the monitoring module 116). If, at 312, no attempt to access the memory is made for at least a threshold period of time, the memory transitions back to the self-refresh mode and the method loops back to 302.

In accordance with various embodiments, an article of manufacture may be provided that includes a storage medium having instructions stored thereon that, if executed, result in the operations described herein with respect to the method 300 (and/or various other operations discussed in the present disclosure). In an embodiment, the storage medium comprises some type of non-transitory memory (not shown). In accordance with various embodiments, the article of manufacture may be a computer-readable medium such as, for example, software or firmware.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A system comprising:
   a memory configured to operate in one of a plurality of states;
   a phase locked loop (PLL) configured to (i) receive a first clock signal, and (ii) based on the first clock signal and a state at which the memory operates, selectively generate a second clock signal,
      wherein during a first time period, (i) the memory operates in a first state of the plurality of states and (ii) based on the memory operating in the first state of the plurality of states, the PLL refrains from generating the second clock signal, and
      wherein during a second time period, (i) the memory operates in a second state of the plurality of states and (ii) based on the memory operating in the second state of the plurality of states, the PLL is configured to generate the second clock signal; and
   a clock selection module configured to, based on the state at which the memory operates, selectively provide one of (i) the first clock signal and (ii) the second clock signal to the memory,
      wherein while the memory operates in the first state during the first time period, the clock selection module is configured to provide the first clock signal to the memory, and
      wherein while the memory operates in the second state during the second time period, the clock selection module is configured to provide the second clock signal to the memory.

2. The system of claim 1, wherein:
   the first state is a self-refresh state; and
   while the memory operates in the self-refresh state, data stored in the memory is periodically refreshed by the memory.

3. The system of claim 1, wherein:
   while the memory operates in the first state, data cannot be (i) read from the memory or (ii) written to the memory.

4. The system of claim 1, the method further comprising:
   a monitoring module configured to, while the memory operates in the first state, detect an attempt to access the memory,
   wherein based on the monitoring module detecting the attempt to access the memory, the memory is configured to transition from the first state to the second state of the plurality of states.

5. The system of claim 4, wherein:
   the second state is a partial sleep state; and
   while the memory operates in the partial sleep state
      data stored in the memory is periodically refreshed by the memory, and
      data is one of (i) written to the memory or (ii) read from the memory.

6. The system of claim 4, wherein:
   the monitoring module is further configured to, while the memory operates in the second state, fail to detect any attempt to access the memory for at least a threshold period of time; and
   based on the monitoring module failing to detect any attempt to access the memory for at least the threshold period of time, the memory is configured to transition from the second state to the first state.

7. The system of claim 1, wherein:
   a frequency of the first clock signal is lower than a frequency of the second clock signal.

8. The system of claim 1, wherein:
   the memory is configured to operate at an active state of the plurality of states, when data is continually one of (i) written to the memory or (ii) read from the memory.

9. The system of claim 1, wherein the system is included in a printing device.

10. The system of claim 1, wherein the memory is a dynamic random-access memory.

11. A method comprising:
   operating a memory in one of a plurality of states, wherein operating the memory in one of the plurality of states comprises (i) during a first time period, operating the memory in a first state of the plurality of states and (ii) during a second time period, operating the memory in a second state of the plurality of states;
   receiving, by a phase locked loop (PLL), a first clock signal;
   based on (i) the first clock signal and (ii) a state at which the memory operates, selectively generating, by the PLL, a second clock signal, wherein selectively generating the second clock signal comprises (i) while the memory operates in the second state, generating, by the PLL, the second clock signal, based on the first clock signal and (ii) while the memory operates in the first state, refraining, by the PLL, from generating the second clock signal; and based on the state at which the memory operates, selectively providing one of (i) the first clock signal and (ii) the second clock signal to the memory, wherein selectively providing one of (i) the first clock signal and (ii) the second clock signal to the memory comprises
- (A) while the memory operates in the first state, providing the first clock signal to the memory, and
- (B) while the memory operates in the second state, providing the second clock signal to the memory.

12. The method of claim 11, wherein:

the first state is a self-refresh state; and while the memory operates in the self-refresh state, data stored in the memory is periodically refreshed by the memory.

13. The method of claim 11, further comprising:

while the memory operates in the first state, detecting an attempt to access the memory; and based on detecting the attempt to access the memory, transitioning an operation of the memory from the first state to the second state of the plurality of states.

14. The method of claim 13, wherein:

the second state is a partial sleep state; and while the memory operates in the partial sleep state
- data stored in the memory is periodically refreshed by the memory, and
- data is one of (i) written to the memory or (ii) read from the memory.

15. The method of claim 13, further comprising:

while the memory operates in the second state, failing to detect any attempt to access the memory for at least a threshold period of time; and based on failing to detect any attempt to access the memory for at least the threshold period of time, transitioning the operation of the memory from the second state to the first state.

16. The method of claim 11, wherein:

a frequency of the first clock signal is lower than a frequency of the second clock signal.

* * * * *